US010064278B2

(12) United States Patent
Val

(10) Patent No.: US 10,064,278 B2
(45) Date of Patent: Aug. 28, 2018

(54) 3D ELECTRONIC MODULE COMPRISING A BALL GRID ARRAY STACK

(71) Applicant: 3D PLUS, Buc (FR)

(72) Inventor: Christian Val, St Remy les Chevreuse (FR)

(73) Assignee: 3D PLUS, Buc (FR)

( * ) Notice: Subject to any disclaimer, the term of this patent is extended or adjusted under 35 U.S.C. 154(b) by 0 days.

(21) Appl. No.: 15/190,837

(22) Filed: Jun. 23, 2016

(65) Prior Publication Data

US 2016/0381799 A1 Dec. 29, 2016

(30) Foreign Application Priority Data

Jun. 25, 2015 (FR) ...................... 15 55857

(51) Int. Cl.
| | | |
|---|---|---|
| *H05K 1/02* | (2006.01) | |
| *H05K 1/14* | (2006.01) | |
| *H05K 1/18* | (2006.01) | |
| *H01L 23/538* | (2006.01) | |
| *H01L 23/66* | (2006.01) | |
| *H01L 23/00* | (2006.01) | |
| *H01L 25/10* | (2006.01) | |
| *H01L 23/498* | (2006.01) | |

(52) U.S. Cl.
CPC ........... *H05K 1/18* (2013.01); *H01L 23/5384* (2013.01); *H01L 23/5387* (2013.01); *H01L 23/5389* (2013.01); *H01L 23/66* (2013.01); *H01L 24/00* (2013.01); *H01L 25/105* (2013.01); *H05K 1/147* (2013.01); *H05K 1/189* (2013.01); *H01L 23/49816* (2013.01)

(58) Field of Classification Search
CPC ........ H05K 1/028; H05K 1/118; H05K 1/147; H05K 1/148; H05K 1/189
See application file for complete search history.

(56) References Cited

U.S. PATENT DOCUMENTS

| | | | |
|---|---|---|---|
| 5,224,023 A | 6/1993 | Smith et al. | |
| 2007/0211711 A1 | 9/2007 | Clayton | |
| 2009/0166065 A1* | 7/2009 | Clayton | ................ H05K 1/189 174/254 |
| 2011/0031628 A1* | 2/2011 | Takada | ..................... G11C 5/04 257/773 |

FOREIGN PATENT DOCUMENTS

WO 2005/104324 A2 11/2005

* cited by examiner

*Primary Examiner* — Hoa C Nguyen
(74) *Attorney, Agent, or Firm* — Baker & Hostetler LLP

(57) ABSTRACT

A 3D electronic module comprises: two electrically tested electronic packages, each comprising at least one encapsulated chip and output balls on a single face of the package, referred to as the main face; two flexible circuits that are mechanically connected to one another, each being associated with a package, and which are positioned between the two packages, each flexible circuit comprising: on one face, first electrical interconnect pads facing the output balls of the associated package; at its end, a portion that is folded over a lateral face of the associated package; second electrical interconnect pads on the opposite face of this folded portion.

9 Claims, 8 Drawing Sheets

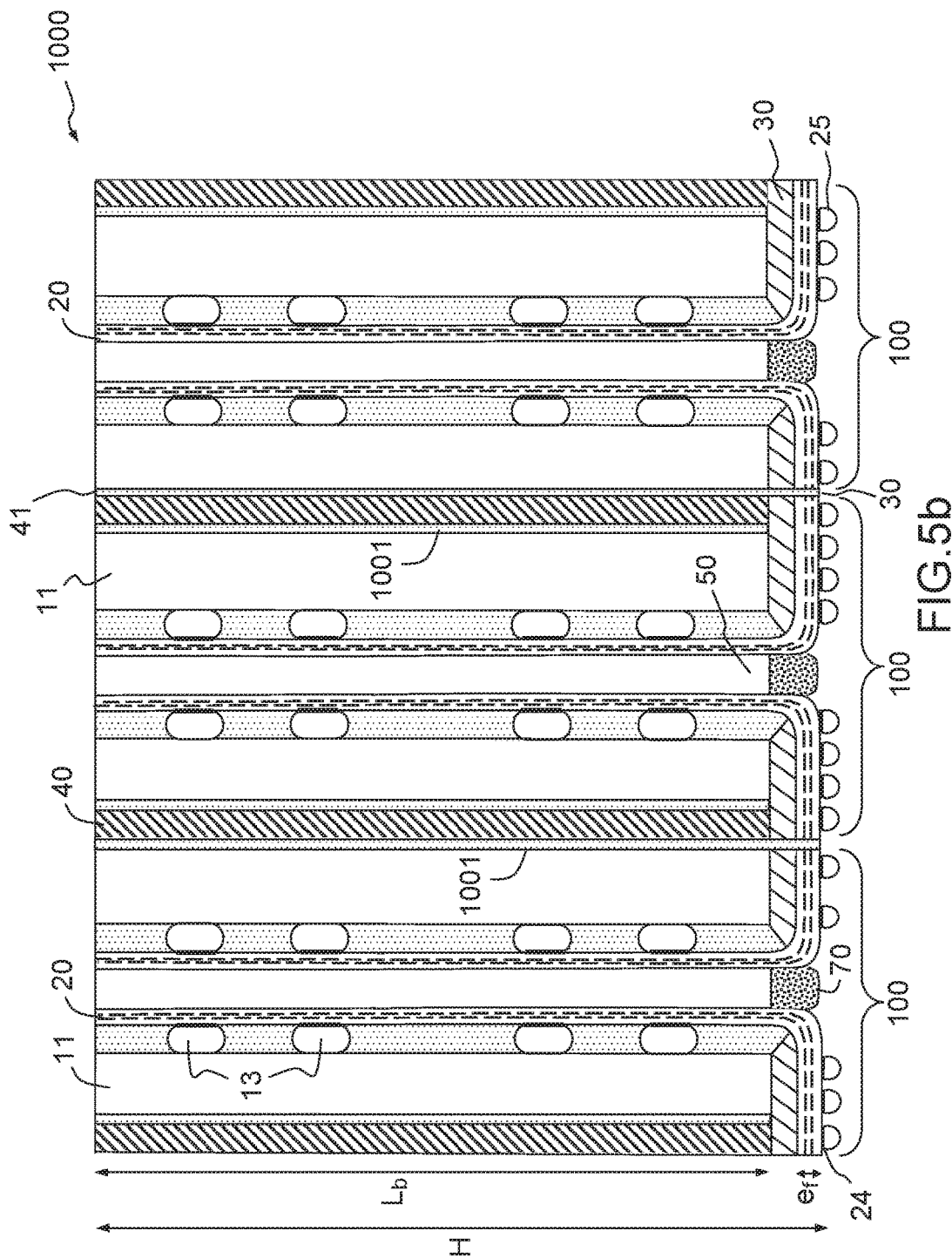

3D ELECTRONIC MODULE COMPRISING A BALL GRID ARRAY STACK

CROSS-REFERENCE TO RELATED APPLICATIONS

This application claims priority to foreign French patent application No. FR 1555857, filed on Jun. 25, 2015, the disclosures of which are incorporated by reference in their entirety.

FIELD OF THE INVENTION

The appearance on the market of components operating at high frequencies (memory, processors, etc.) has resulted in the use of unencapsulated chips (bare chips) posing new performance problems. Probe testing of bare chips becomes very tricky beyond frequencies of about 1 GHz. The first consequence is that in the case of a stack of these components in a 3D electronic module, certain chips will be able to operate at maximum frequency, while others will not; the result is that a module comprising a plurality of chips will not be able to operate at maximum frequency.

BACKGROUND

One way of circumventing this difficulty is to use encapsulated chips, i.e. chips placed in a package which may itself be completely tested. Specifically, a package comprises outputs taking the form of solder balls which are spaced further apart than the pads of the chips, for example:
spacing of the chip pads: 50 to 100 µm;
spacing of the ball grid array packages encapsulating a chip: from 400 to 800 µm.
Test sockets may therefore be used and the packages are thus able to be tested.

In light of this observation, a stacking technology that is suited to these packages and that is able to operate at high frequency must be found.

SUMMARY OF THE INVENTION

A new technique for stacking these types of packages is therefore proposed. More specifically, a subject of the invention is a 3D electronic module comprising:
two electrically tested electronic packages, each comprising at least one encapsulated chip and output balls on a single face of the package, referred to as the main face, joining two lateral faces;
positioned between the two packages, two flexible circuits that are mechanically connected to one another and positioned between the two packages, each flexible circuit being associated with a package and comprising:
on one face, first electrical interconnect pads in contact with the balls of the associated package;
at its end, a portion that is folded over a lateral face of the associated package;
second electrical interconnect pads on the opposite face of this folded portion.

According to one feature of the invention, the two flexible circuits are mechanically and electrically connected to one another by a rigid printed circuit board that is sandwiched between the two flexible circuits.

This rigid circuit may comprise passive and/or active components that are potentially embedded in the rigid circuit.

The 3D module preferably comprises a bead of epoxy resin that is positioned on the border of the module between the two flexible circuits along the fold of the flexible circuits.

At least one of the two packages is thinned until a face of the chip becomes visible; the package then advantageously comprises a radiator placed on the visible face of the chip.

According to another feature of the invention, at least one of the two flexible circuits is folded, at its other end, over another lateral face of the package opposite the first lateral face, the flexible circuit comprising passive and/or active components at this other end. The term "active component" refers to a bare or encapsulated chip.

The passive and/or active components typically operate at frequencies that are higher than 1 GHz.

The invention also relates to a 3D electronic stack, characterized in that it comprises a stack of multiple 3D electronic modules such as described, which modules are bonded to one another by faces opposite the main faces.

Another subject of the invention is a 3D electronic device comprising an interconnect printed circuit board and a 3D electronic module or a stack such as have been described, mounted on the interconnect printed circuit board and electrically connected thereto via electrical interconnect balls that make contact with the second electrical interconnect pads of the flexible circuits.

BRIEF DESCRIPTION OF THE DRAWINGS

Other features and advantages of the invention will become apparent on reading the detailed description which follows, given by way of non-limiting example and with reference to the appended drawings in which:

FIGS. 5a-5b diagrammatically show an example of a stack of 3D electronic modules with thinned packages that are equipped with radiators, some of which are shared with two adjacent modules, with (FIG. 5a) or without (FIG. 5b) active and/or passive components mounted on the flex circuits.

From one figure to another, the same elements bear the same references.

DETAILED DESCRIPTION

Figure 1:
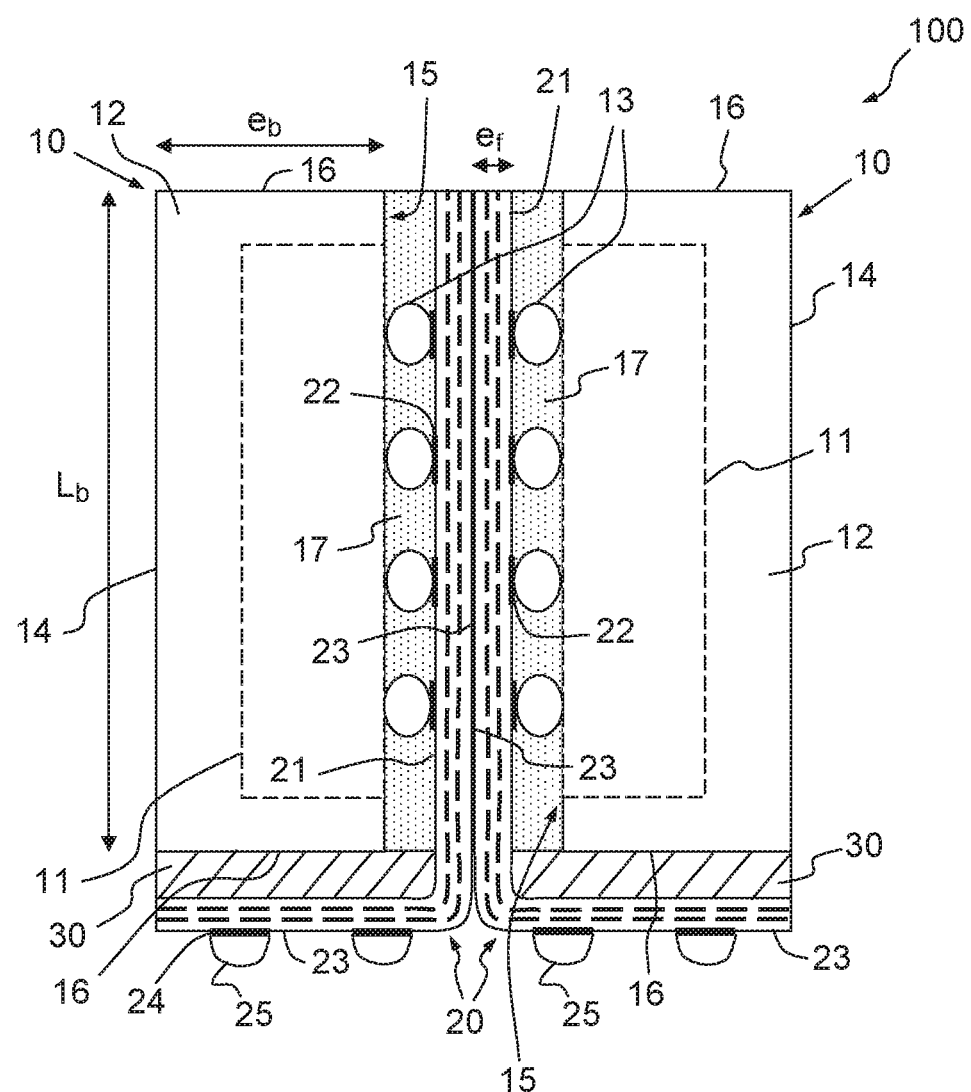
FIG. 1 diagrammatically shows a first example of a 3D electronic module according to the invention.

In the rest of the description, the expressions "high", "low", "front", "back" and "side" are used with reference to the orientation of the described figures. In so far as the module, stack or device may be positioned according to other orientations, the directional terminology is indicated by way of illustration and is not limiting.

A first example of a 3D electronic module according to the invention is described with reference to FIGS. 1 and 2. Two ball grid array (BGA) packages are mounted on both faces of a substrate comprising two adjoined flexible or flex printed circuit boards (PCBs).

The ball grid array (BGA) packages 10 each comprise at least one chip 11 that is encapsulated in an epoxy-type resin 12; each chip 11 is connected to output balls 13 of the package that are positioned on a single face of the package, referred to as the main face 15. A package 10 with length $L_b$, width $I_b$ and thickness $e_b$ thus has a main face 15 and an opposite face, referred to as the outer face 14, both with dimensions $L_b \times I_b$, and lateral faces 16 with dimensions $I_b \times e_b$. The following dimensions are typical:

6 mm≤$L_b$≤9 mm;
6 mm≤$I_b$≤14 mm;
0.8 mm≤$e_b$≤1.4 mm.

These packages 10 that are intended to be stacked are electrically tested by their manufacturer by means of test sockets and appropriate testers, then marketed as tested packages. Among the manufacturers of such tested packages, mention may be made of: Micron, Xilinx, Samsung, Freescale, Infineon, STMicroelectronics, etc. The 3D module according to the invention comprises such tested packages.

Two tested packages are mounted on the two faces of a substrate, referred to as a PCB below, facing one another. More specifically, the PCB is composed of two flexible circuits 20. Each flexible circuit 20 of length $L_f$ ($L_f=L_{f1}+L_{f2}$), width $I_f$ and thickness $e_f$ also has a main face 21 equipped with first interconnect pads 22 that are distributed like the balls 13 of the package, an opposite face 23 with dimensions $L_f \times I_f$ and lateral faces with dimensions $I_f \times e_f$. We have:

$L_f \geq L_b + e_b$ and $I_f = I_b$.

The following dimensions are typical:
7 mm≤$L_f$≤11 mm;
6 mm≤$I_f$≤14 mm;
0.8 mm≤$e_b$≤1.4 mm.

A flex circuit 20, which is generally multilayered, is in general made of polyimide, i.e. without glass fibre inside, in order to allow substantial deformation, such as folding; the polyimide may also be replaced by an epoxy resin without fibre reinforcement. It comprises electrical tracks that are intended to guide the signals between the first electrical interconnect pads 22 that are positioned on the main face 21 of the flex (and that make contact with the output balls 13 of the package) and second electrical interconnect pads 24 that are located on the opposite face 23 of a portion 26 of the flex circuit (which is intended to be folded over a lateral face of the package), with dimensions $L_{f2} \times I_f$; these second interconnect pads 24, which in FIG. 2 are on the non-visible face 23, are marked by dotted lines. Typically:

$L_{f1}=L_b$ and $L_{f2} \geq e_b$.

Each package 10 is therefore mounted on a flex circuit 20 so as:

to place the output balls 13 of the package and the first interconnect pads 22 of the main portion 27 of the flex circuit (which will not be folded) in mechanical and electrical contact (by soldering, e.g. by using conventional lead-containing or lead-free solders), a portion 26 of the flex circuit therefore protrudes from the main portion 27; and to place a lateral face 16 of the package in mechanical contact with this (protruding) portion 26 of the flex circuit by folding the latter by 90° so that the second interconnect pads 24 are level with said lateral face 16 of the package.

A filled resin 17 (epoxy resin for example) is inserted between the balls 13 in a conventional manner.

These portions 26 are bonded to the lateral faces of the package. This bonding is carried out using a tool or jig allowing the portions 26 that are bonded to the lateral faces 16 to be kept perfectly flat. The adhesive 30 plays the role of level adaptor between the lateral faces 16 of the package and the folded flexible portions 26. This is very important as packaging and, in particular, BGA packages generally exhibit a curvature, also known as "warpage", on delivery, which curvature may reach 50 to 150 μm depending on the dimensions of the package; this curvature is therefore detrimental to the coplanarity of the balls 25 and hence to the soldering performance.

Two pairs of packages/flex circuits are thus obtained, which are themselves assembled by bonding the opposite faces 23 of the flex circuits (adhesive not shown in the figures) in order to ultimately form a 3D module with two packages 10 and a PCB as shown in FIG. 1. Solder balls 25 will be positioned on the second interconnect pads 24 in order to allow this 3D module to be mounted on the user's printed circuit board (or PCB).

Figure 3:
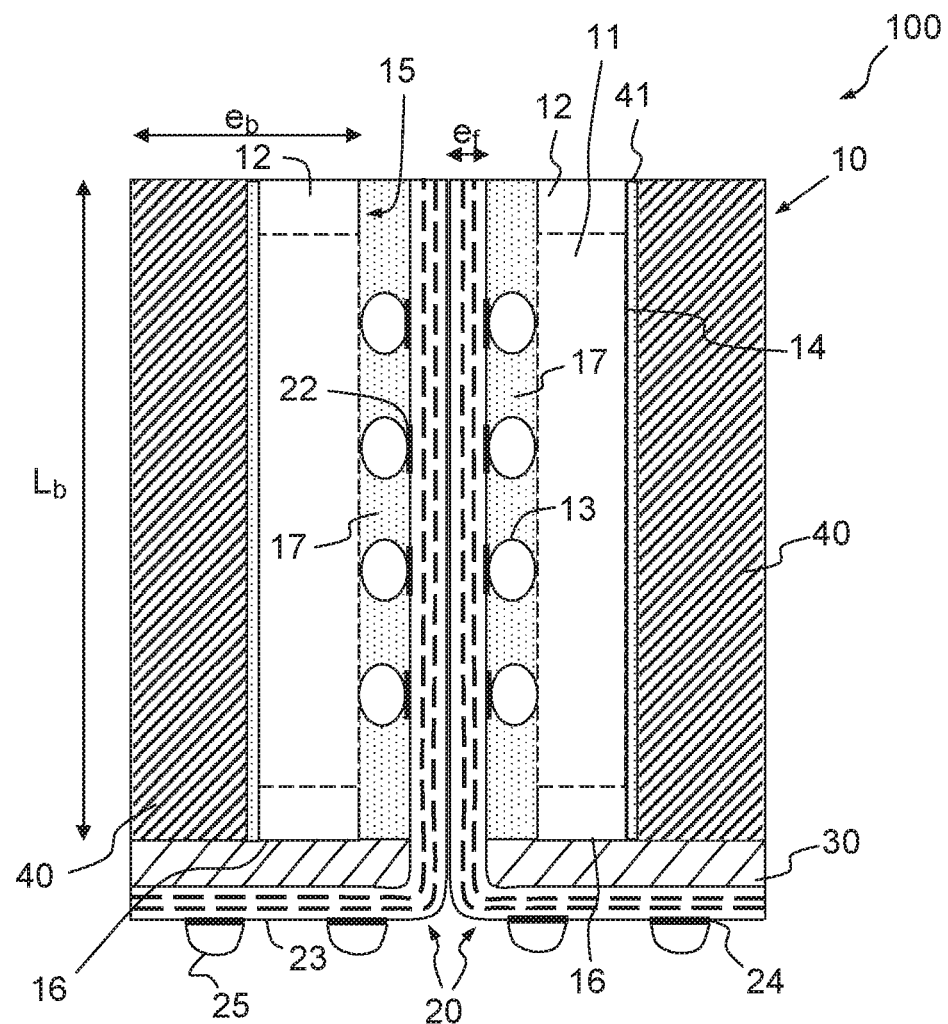
FIG. 3 diagrammatically shows a second example of a 3D electronic module according to the invention, with thinned packages that are equipped with radiators.

Each package 10 may be thinned as shown in FIG. 3: the back face of the chip 11 becomes visible after thinning. The outer face 14 of a thinned package may receive a, for example metal, radiator 40, in order to remove the heat generated by the chips 11. The radiator 40 is subsequently connected to a cold plate via cross sections thereof. The thermal connection 41 between the radiator and the back face of the chip 11 is achieved either, in general, using thermal adhesive or, best of all, using a solder; in this latter case, the outer face 14 is metallized, e.g. via chemical deposition of nickel and gold. With this approach, the length L of the portion 26 of the flex circuit is increased, thereby allowing the number of second interconnect pads 24 or the spacing to be increased. A 3D module may comprise a radiator 40 on each package 10 as shown in FIG. 3, or a single radiator on one package which will be shared with another package of another 3D module, as will be seen below in the case of a stack of 3D modules. In this case, the length L varies from one flex circuit to the other as may be seen for the modules 100 of FIGS. 5a and 5b.

Figure 2:
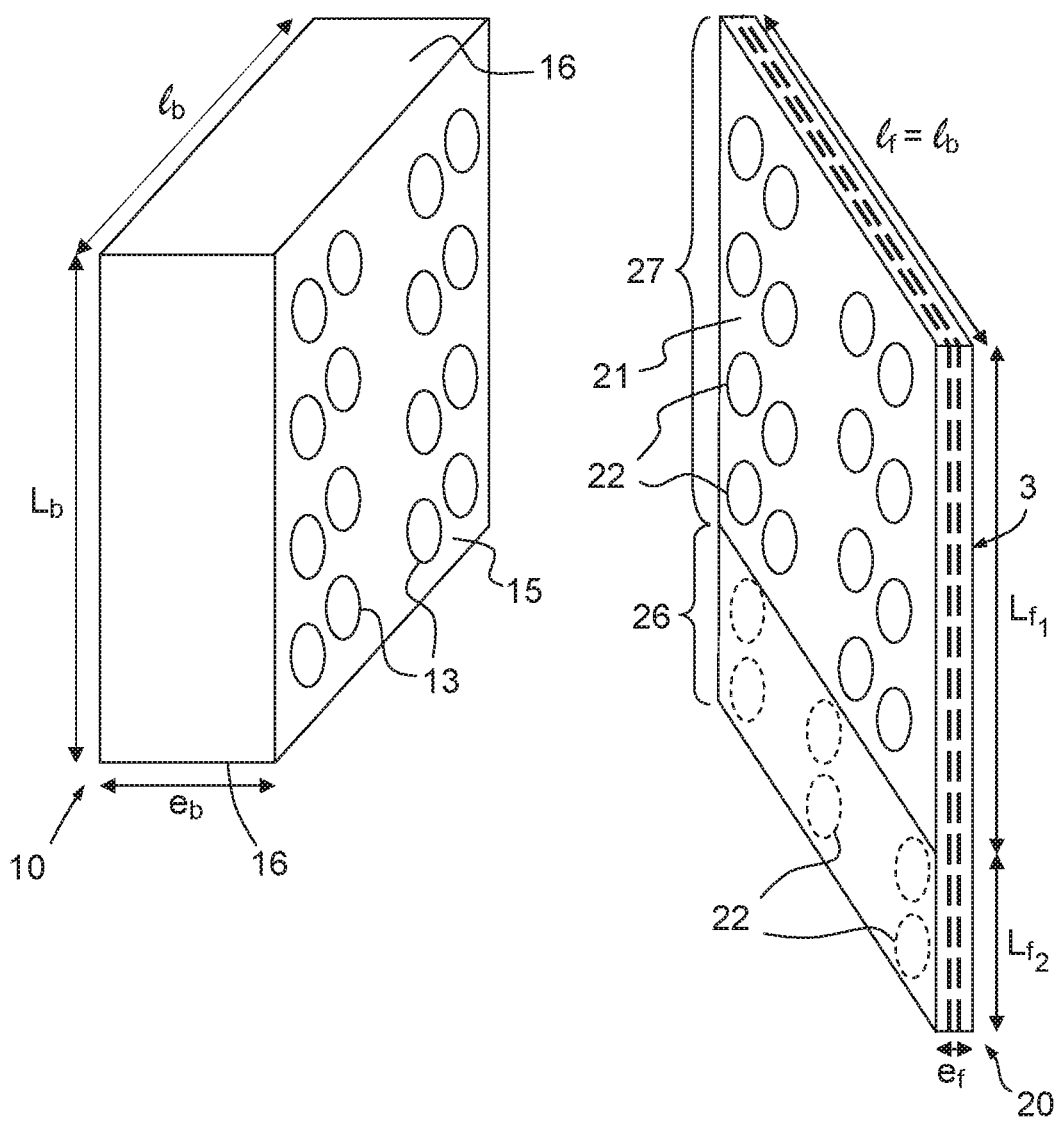
FIG. 2 diagrammatically shows an exploded view of an example of elements of a 3D electronic module according to the invention: a package and the flexible (or "flex") circuit that is associated therewith.

As shown in FIGS. 1 to 3, the pairs of packages/flex circuits may be assembled directly or, as shown in FIGS. 4a-4c and 5a-5b, via a central rigid printed circuit board 50, referred to as the "core" circuit, with length $L_c$, width $I_c$ and thickness $e_c$, comprising ground and supply planes, which circuit is mechanically and electrically connected to the portions 27 of the two flex circuits 20 via its faces with dimensions $L_c \times I_c$. Stated otherwise, it is possible for the PCB to comprise only the two flex circuits 20 or to comprise a "core" circuit 50 between the two flex circuits 20. In practice, the PCB circuit comprising the two flex circuits 20, with the "core" circuit 50 between the two, is produced first before each package 10 is mounted on either side of the PCB circuit and the portions 26 of the two flex circuits that protrude from the packages folded over the lateral faces 16 of the packages.

Figure 4A:
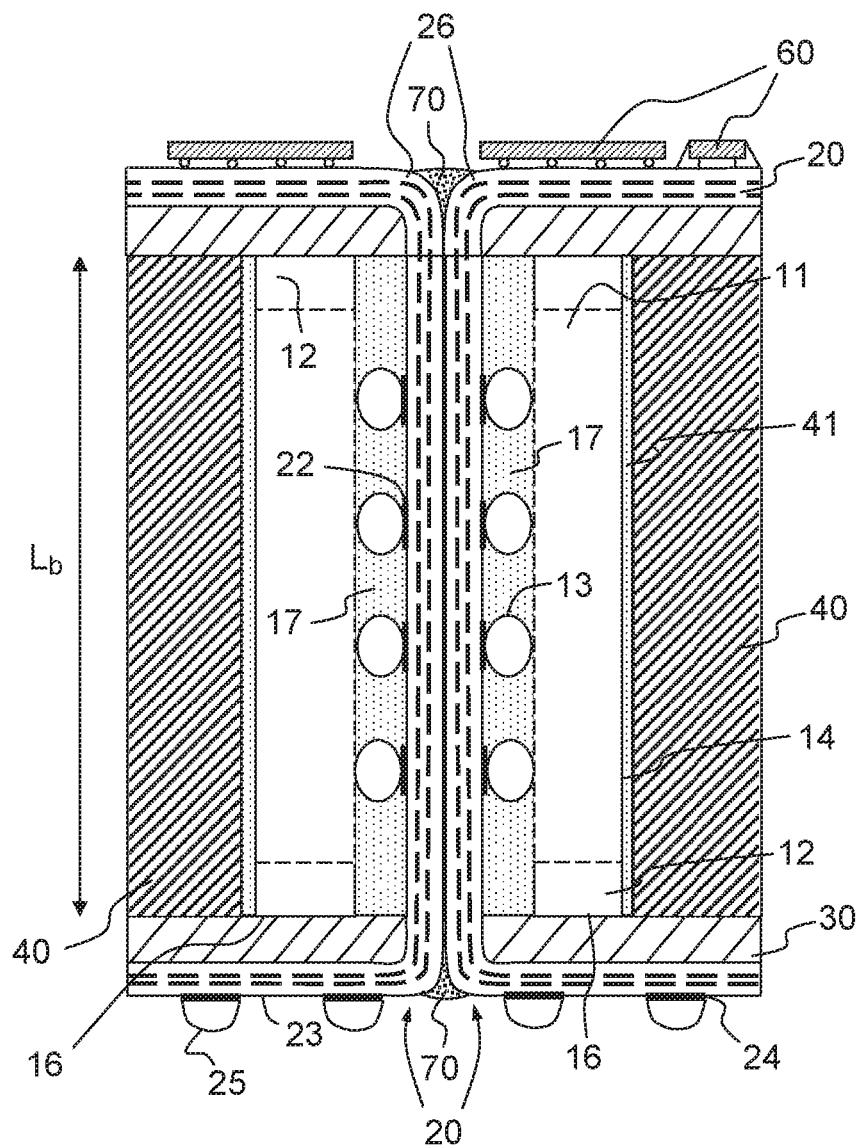
FIGS. 4a-4c diagrammatically show a third example of a 3D electronic module with passive and/or active components:
that are mounted on two flex circuits (FIG. 4a) or
that are integrated in the rigid circuit (or "core" circuit) (FIG. 4b) or
that are mounted on the surface of the "core" circuit (FIG. 4c)
Figure 4B:
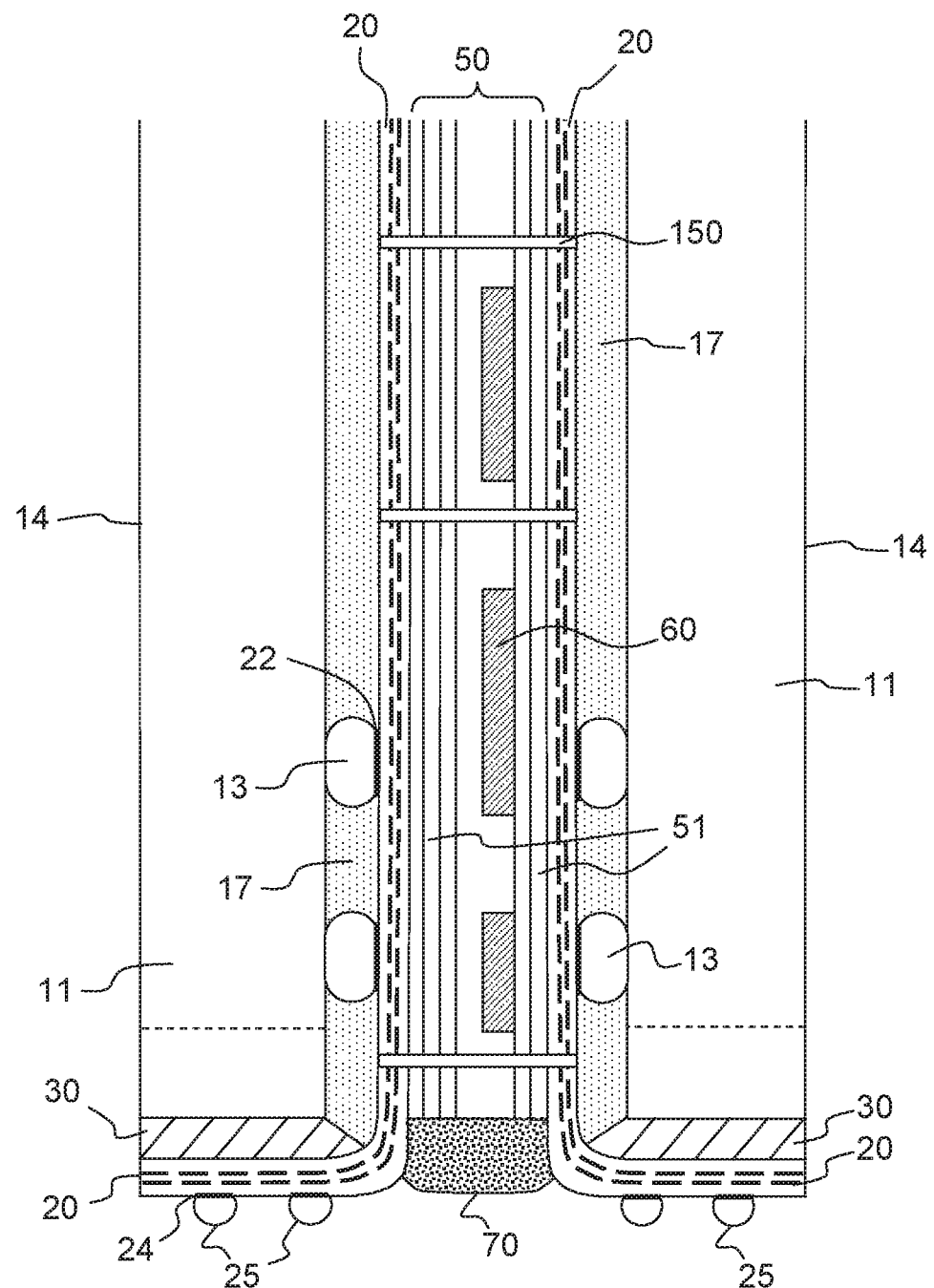

FIG. 4b shows an example of a 3D module according to the invention, comprising, in the PCB between the two flex circuits 20, a, generally multilayered, "core" circuit 50 integrating active and/or passive components 60 and, in particular, decoupling capacitors. In FIG. 4b, the layer integrating the components 60 is between two layers 51 on one side and three layers 51 on the other. These capacitors, placed as close as possible to the chips 11 of the packages 10, allow power to be delivered with minimal inductance.

The active and passive components 60 are placed within the thickness of the "core" circuit 50; the other levels are subsequently bonded to the components as is the case when a PCB is being produced. The metallized through-holes 150 pass through all (as shown in the figure) or part of the "core" and the two flex circuits (or flexes) in order to make the interconnections.

Figure 4C:
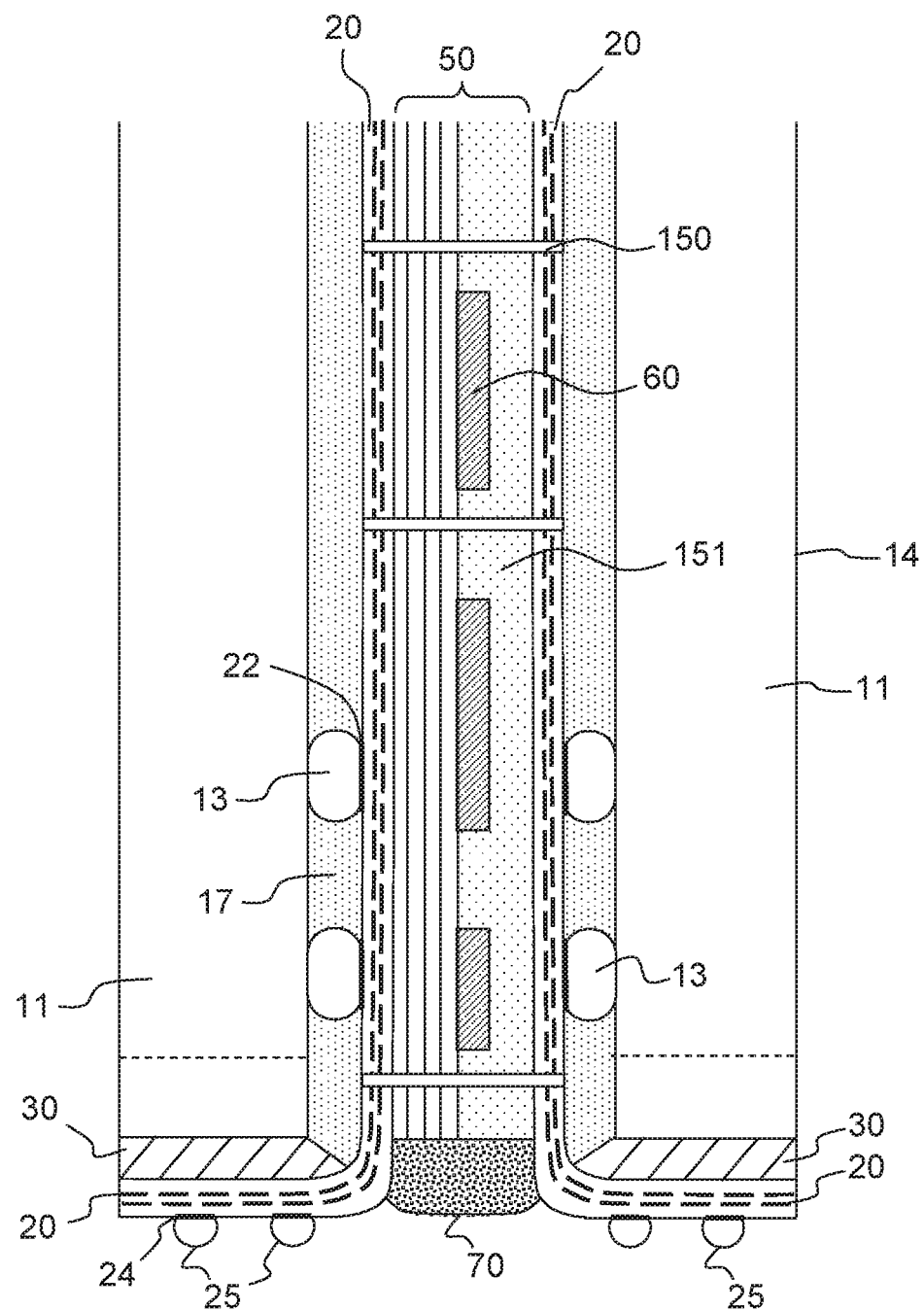

According to one alternative that may be seen in FIG. 4c, the active and/or passive components 60, in particular the capacitors, may be mounted on the surface of the "core" circuit 50 that comprises multiple layers 51; these components 60 are generally very small format (402, i.e. 1 mm×0.5 mm, format) components, which allows enough space to be left for the metallized through-holes that will pass through the "core" circuit 50. The components 60 are mounted on the PCB using surface-mount techniques, then resin 151 is deposited onto these components 60 in order to have a planar surface that will receive the adhesive allowing the flex 20 to be bonded thereto. The current thickness of capacitors (e2) is 0.6 mm and certain suppliers are already proposing thicknesses of less than 0.4 mm; the thickness of the mounted component 60 will therefore be 0.7 mm with a decrease to 0.5 mm for (e3). A total thickness (e4) of 1.7 mm to 1.5 mm is entirely possible.

FIG. 4a shows the module with flex circuits 20 folded over the two opposite lateral faces 16 of each package 10. The main advantage is due to the separation of functions:

Flexes folded over a lateral face 16 of the package (at the bottom of the figure) and bearing the outer connections (the balls 25).

Flexes folded over a lateral face 16 of the package, which face is opposite the preceding face (at the top of the figure), with the active and/or passive components 60 (capacitors, resistors, etc.) and/or "buffer"-type active circuits mounted on their faces 23, thus making the "core" circuit 50 unnecessary.

Potentially, only one of the two flex circuits 20 comprises components 60 on its upper folded portion.

This approach, with passive and/or active components (which are integrated in the "core" circuit or mounted thereon, or on the flexes), allows the 3D module to be made electrically autonomous like a DIMM (dual in-line memory module), whether it is an RDIMM (registered dual in-line memory module) or an LRDIMM (load-reduced dual in-line memory module)

Figure 5A:
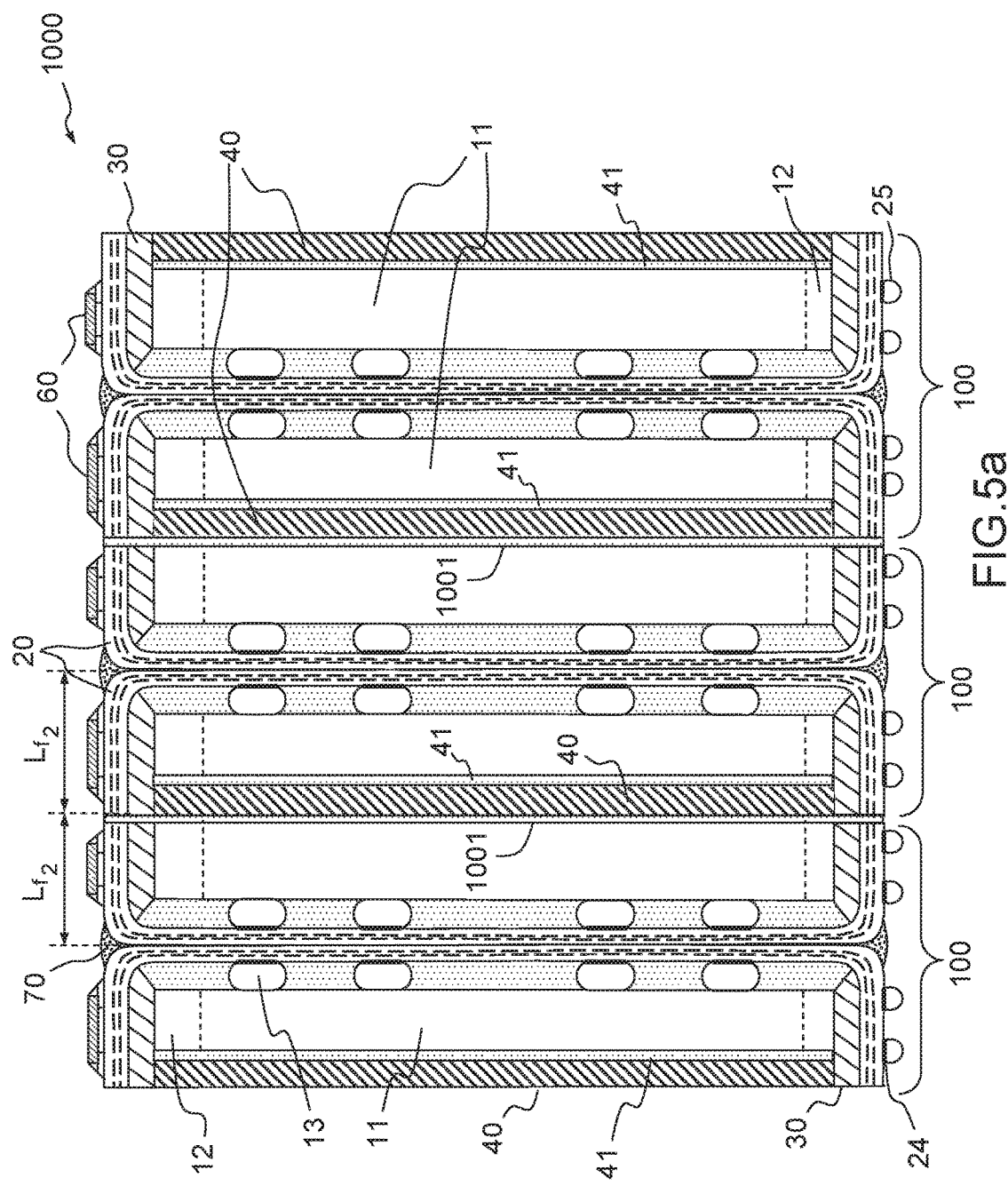

Preferably, when the PCB of a 3D module 100 comprises a "core" circuit 50 positioned between the two flex circuits 20, a bead 70 of silica-filled epoxy resin is introduced between the bends formed, respectively, by each flex circuit 20 when folded over the lateral face 16 of the associated package 10. This bead 70 therefore spreads out over the width $I_f$, allowing potential ingresses of flux to be avoided during the step of soldering the balls 25 to the interconnect pads 24 of the "flex" circuits. In the case of a flex circuit folded over both lateral faces of the package, two beads 70 will be positioned as shown in FIGS. 4a and 5a.

Multiple 3D modules 100 thus obtained may be stacked; they are typically bonded using an adhesive or an epoxy-type resin 1001. FIGS. 5a and 5b show a stack 1000 of three modules 100 therefore comprising a total of six packages 10, but this is not limiting as the thermal resistance of each package no longer depends on the stack as in the case of superposed packages; indeed, each package 10 has the same thermal resistance as it is not affected by its neighbours.

In these figures, the packages 10 are thinned and equipped with radiators 40, some of which are shared between two packages 10 of adjacent modules 100, in particular in order not to increase the ultimate thickness of the stack 1000. In FIG. 5a, the flex circuits 20 are folded over each lateral package face 16 with the connections (the balls 25), on one side, and the passive and/or active components 60 on the other; the "core" circuits 50 are therefore unnecessary. In FIG. 5b, the flex circuits 20 are folded over a single lateral package face 16 with the connections (the balls 25), and the passive and/or active components are integrated in the "core" circuits 50. However, any of the 3D modules described above may be stacked and bonded to one another using a thermal adhesive or by soldering; a 3D module with a thinned package without passive components facing a lateral face 16 may be stacked onto a 3D module with a non-thinned package with passive components, etc. This stack 1000 is of course intended to be mechanically and electrically connected to the user's interconnect circuit (not shown) via the second interconnect pads 24 of each flex circuit and the solder balls 25 positioned on these pads.

The main advantages of this 3D stacking technology with respect to all others currently known are numerous:
no routing on the lateral faces of the module;
no through-polymer vias (TPVs) or through-mould vias (TMVs) for the inter-level interconnect;
coplanarity of the balls by construction due to bonding using a jig;
essentially no limit on the number of packages to be stacked;
possibility to integrate the capacitative decoupling in the user's interconnect PCB:
no moulding;
no metallization of module faces;
no laser etching.

One drawback could be the height H of the 3D module which is dependent on the length $L_b$ of the standard BGA packages that vary between 6 and 9 mm, to which should be added the thickness $e_f$ of the folded flex and that of the balls, namely about 700 to 800 μm for a fold over one side.

This stacking method is particularly advantageous for the stacking of memory packages.

The invention claimed is:

1. A 3D electronic module comprising:
two electrically tested electronic packages, each comprising at least one encapsulated chip and output balls on a single face of the package, referred to as a main face, joining two lateral faces;
positioned between the two packages, two flexible circuits that are mechanically connected to one another, each flexible circuit being associated with a respective one of the two packages and each flexible circuit comprising:
on one face, first electrical interconnect pads in contact with the output balls of the associated package;
at its end, a portion that is folded at 90° and bonded over a lateral face of the associated package, and extends a length to simply cover the lateral face;
second electrical interconnect pads on the opposite face of the folded portion.

2. The 3D electronic module according to claim 1, wherein the two flexible circuits are mechanically and electrically connected to one another by a rigid printed circuit board that is positioned between the two flexible circuits.

3. The 3D electronic module according to claim 2, wherein the rigid printed circuit board comprises passive and/or active components.

4. The 3D electronic module according to claim 1, comprising a bead of epoxy resin that is positioned on a border between the two flexible circuits along a fold of the flexible circuits.

5. The 3D electronic module according to claim 1, wherein at least one package is configured to be thinned until a face of the chip becomes visible and comprises a radiator placed on said face of the chip.

6. The 3D electronic module according to claim 1, wherein at least one flexible circuit is folded, at its other end, over a lateral face of the package opposite the first lateral face, the flexible circuit comprising passive and/or active components at the other end.

7. The 3D electronic module according to claim 1, comprising passive and/or active components operating at frequencies that are higher than 1 GHz.

8. A 3D electronic stack comprising a stack of multiple 3D electronic modules according to claim 1, which modules are bonded to one another by faces opposite the main faces.

9. A 3D electronic device comprising the 3D electronic module according to claim 1, and further comprising the interconnect printed circuit board, the 3D electronic module is mounted on the interconnect printed circuit board and electrically connected to the interconnect circuit via interconnect balls that make contact with second interconnect pads of the flexible circuits.

* * * * *

UNITED STATES PATENT AND TRADEMARK OFFICE
CERTIFICATE OF CORRECTION

PATENT NO. : 10,064,278 B2
APPLICATION NO. : 15/190837
DATED : August 28, 2018
INVENTOR(S) : Christian Val Page 1 of 1

It is certified that error appears in the above-identified patent and that said Letters Patent is hereby corrected as shown below:

In the Claims

In Line 21, Column 7, in Claim 9, "the interconnect printed circuit board" should be --an interconnect printed circuit board--.

Signed and Sealed this
Fourth Day of December, 2018

Andrei Iancu
*Director of the United States Patent and Trademark Office*